(12) United States Patent
Chang et al.

(10) Patent No.: US 9,349,640 B1
(45) Date of Patent: May 24, 2016

(54) ELECTRODE PAIR FABRICATION USING DIRECTED SELF ASSEMBLY OF DIBLOCK COPOLYMERS

(71) Applicant: International Business Machines Corporation, Armonk, NY (US)

(72) Inventors: Josephine B. Chang, Mahopac, NY (US); Michael A. Guillorn, Yorktown Heights, NY (US); Hiroyuki Miyazoe, White Plains, NY (US); Adam M. Pyzyna, Cortlandt Manor, NY (US); Hsinyu Tsai, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/749,896

(22) Filed: Jun. 25, 2015

Related U.S. Application Data (63) Continuation of application No. 14/609,709, filed on Jan. 30, 2015.

(51) Int. Cl.
*H01L 21/4763* (2006.01)
*H01L 21/768* (2006.01)

(52) U.S. Cl.
CPC ...... *H01L 21/76877* (2013.01); *H01L 21/7684* (2013.01); *H01L 21/76816* (2013.01); *H01L 21/76864* (2013.01)

(58) Field of Classification Search
CPC .................. H01L 21/76877; H01L 21/76816; H01L 21/7684; H01L 21/76864; H01L 45/1253; H01L 29/41; H01L 29/413

USPC .......................................................... 438/618
See application file for complete search history.

(56) References Cited

U.S. PATENT DOCUMENTS

| | | | |
|---|---|---|---|
| 6,358,813 B1 | 3/2002 | Holmes et al. | |
| 7,767,099 B2 | 8/2010 | Li et al. | |
| 7,839,622 B2 | 11/2010 | Matters-Kammerer | |
| 8,083,953 B2 | 12/2011 | Millward et al. | |
| 8,247,904 B2 | 8/2012 | Bangsaruntip et al. | |
| 8,309,278 B2 | 11/2012 | Yang et al. | |
| 8,668,833 B2 * | 3/2014 | Chew ..................... | B82Y 40/00 216/17 |

(Continued)

OTHER PUBLICATIONS

List of IBM Patents or Patent Applications Treated as Related—submitted on Jun. 25, 2015, (U.S. Appl. No. 14/609,709, filed Jan. 30, 2015).

(Continued)

*Primary Examiner* — Tu-Tu Ho
(74) *Attorney, Agent, or Firm* — Scully, Scott, Murphy & Presser, P.C.; Louis J. Percello, Esq.

(57) ABSTRACT

Structures including alternating first U-shaped electrodes and second U-shaped electrodes and contact pads interconnecting the first and the second U-shaped electrodes are provided. Each of the first U-shaped electrodes includes substantially parallel straight portions connected by a bent portion located on one end of a substrate. Each of the second U-shaped electrodes includes substantially parallel straight portions connected by a bent portion located on an opposite end of the substrate. Every adjacent straight portions of neighboring first and second U-shaped electrodes constitute an electrode pair having a sub-lithographic pitch. Each of the contact pads overlaps and contacts the bent portion of one of the first and the U-shaped electrodes.

12 Claims, 10 Drawing Sheets

(56) References Cited

U.S. PATENT DOCUMENTS

| | | |
|---|---|---|
| 9,006,743 B2 | 4/2015 | Xue |
| 2011/0147984 A1 | 6/2011 | Cheng et al. |
| 2012/0164392 A1 | 6/2012 | Stoykovich et al. |

OTHER PUBLICATIONS

U.S. Notice of Allowance dated Dec. 14, 2015 received in U.S. Appl. No. 14/609,709.

Jeong, S.J. et al. "Soft Graphoepitaxy of Block Copolymer Assembly with Disposable Photoresist Confinement" Nano Letters (Jun. 2009) pp. 2300-2305, vol. 9, No. 6.

Stoykovich, M.P. et al., "Directed Self-Assembly of Block Copolymers for Nanolithography: Fabrication of Isolated Features and Essential Integrated Circuit Geometries" ACS Nano (Nov. 2007) pp. 168-175, vol. 1, No. 3.

Cao, Y. et al., "Using Process Monitor Wafers to Understand Directed Self-Assembly Defects" Proc. SPIE Alternative Lithographic Technologies V (Mar. 2013) pp. 8601S-1-8601S-7, vol. 8680.

Tiron, R. et al., "Optimization of block copolymer self-assembly through graphoepitaxy: A defectivity study" J. Vac. Sci. Technol. B (Nov. 2011) pp. F206-1-F206-8, vol. 29, No. 6.

Liu, C.C. et al., "Chemical Patterns for Directed Self-Assembly of Lamellae-Forming Block Copolymers with Density Multiplication of Features" Macromolecules (Feb. 2013) pp. 1415-1424, vol. 46.

Patel, K.C. et al., "Line Frequency Doubling of Directed Self Assembly Patterns for Single-Digit Bit Pattern Media Lithography" Proc. of SPIE symposium on Alternative Lithographic Technologies IV (Mar. 2012) pp. 83230U-1-83230U-9, vol. 8323.

Ross, C.A. et al., "Templated self-assembly of Si-containing block copolymers for nanoscale device fabrication" SPIE Proceedings on Alternative Lithographic Technologies II (Feb. 23-25, 2010) pp. 76370H-1-76370H-7, vol. 7637.

Borah, D. et al., "Directed self-assembly of PS-b-PMMA block copolymer using HSQ lines for translational alignment" Journal of Materials Chemistry (Jan. 2013) pp. 1192-1196, vol. 1, No. 6.

U.S. Appl. No. 14/609,709, filed Jan. 30, 2015.

\* cited by examiner

ELECTRODE PAIR FABRICATION USING DIRECTED SELF ASSEMBLY OF DIBLOCK COPOLYMERS

BACKGROUND

The present disclosure relates generally to nanoscale structures, and more particularly, to structures including electrode pairs having a sub-lithographic pitch (i.e., less than 80 nm) and contact pads interconnecting the electrode pairs and methods of manufacturing the same.

Closely spaced electrode pairs have been used for a variety of applications including sensing or electrical characterization of molecules or materials, nonvolatile memory cells such as phase-change memory (PCM) or resistive random-access memory (RRAM) bridge cells, or as defect monitoring structures. Fabrication of electrode pairs with precisely controlled interelectrode gaps less than 20 nm is challenging due to the limitations of patterning technology. In addition, fanning these closely spaced electrode lines out to enable electrical testing is also very challenging. Structures for providing such electrode pairs having a sub-lithographic pitch and electrical contacts that interconnect the electrode pairs are thus desired.

SUMMARY

The present application provides structures including alternating first U-shaped electrodes and second U-shaped electrodes and contact pads interconnecting the first and the second U-shaped electrodes. Each of the first U-shaped electrodes includes substantially parallel straight portions connected by a bent portion located on one end of a substrate. Each of the second U-shaped electrodes includes substantially parallel straight portions connected by a bent portion located on an opposite end of the substrate. Every adjacent straight portions of neighboring first and second U-shaped electrodes constitutes an electrode pair having a sub-lithographic pitch. Each of the contact pads overlaps and contacts the bent portion of one of the first and the U-shaped electrodes. In the present application, since the bent portions of the first and second U-shaped electrodes have a greater dimension that that of the straight portions of the first and second U-shaped electrodes, the placement tolerance of the contact pads is improved.

According to one aspect of the present application, a semiconductor structure is provided. The semiconductor structure includes a plurality of first U-shaped electrodes embedded in a dielectric material layer. Each of the first U-shaped electrodes has straight portions extending substantially in parallel and connected by a bent portion located on one end of the dielectric material layer. The semiconductor structure further includes a plurality of second U-shaped electrodes embedded in the dielectric material layer and separating the plurality of first U-shaped electrodes from one another. Each of the second U-shaped electrodes has straight portions extending substantially in parallel and connected by a bent portion located on an opposite end of the dielectric material layer. Yet further, the semiconductor structure includes a plurality of contact pads embedded in the dielectric material layer. The contact pads overlap and contact the bent portions of the plurality of first U-shaped electrodes and the plurality of second U-shaped electrodes.

According to another aspect of the present application, a method of forming a semiconductor structure is provided. The method includes first forming a patterned template layer over a dielectric material layer disposed on a substrate. The patterned template layer comprises a contiguous trench configured to guide self-assembly of a self-assembly material. Next a self-assembly material is deposited onto the dielectric material layer. The self-assembly material fills the contiguous trench. The self-assembly material is annealed to cause self-assembly of the self-assembly material such that a self-assembly nanostructure comprising a plurality of first U-shaped lines and a plurality of second U-shaped lines distributed in a matrix is formed. Each of the plurality of first U-shaped lines includes straight portions extending substantially in parallel and a bent portion connecting the straight portions and located on one end of the dielectric material layer, each of the plurality of second U-shaped lines includes straight portions extending substantially in parallel and a bent portion connecting the straight portions and located on an opposite end of the dielectric material layer, and the plurality of first U-shaped lines are separated from one another by one of the plurality of second U-shaped lines. Next, a plurality of first U-shaped trenches is formed by transferring a pattern of the plurality of first U-shaped lines into the dielectric material layer and a plurality of second U-shaped trenches is formed by transferring a pattern of the plurality of second U-shaped lines into the dielectric material layer. Next, a plurality of contact trenches is formed in the dielectric material layer. The plurality of contact trenches intersects the bent portions of the plurality of first U-shaped trenches and the plurality of second U-shaped trenches. The plurality of first U-shaped trenches, the plurality of second U-shaped trenches and the plurality of contract trenches are then filled by a conductive material.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1A:
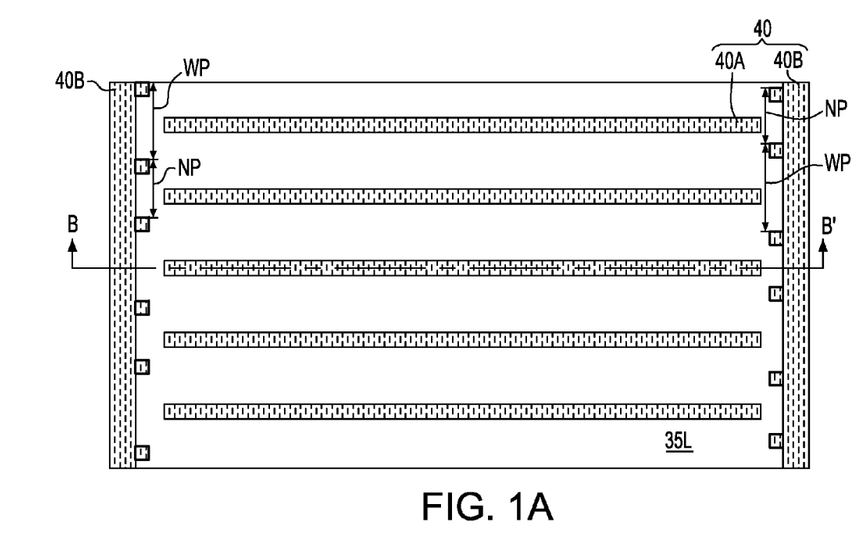
FIG. 1A is a top view of a first exemplary semiconductor structure including a patterned template layer formed on a stack of a substrate, a dielectric material layer, an organic planarization layer (OPL), and a hard mask layer according to an embodiment of the present application.
Figure 1B:
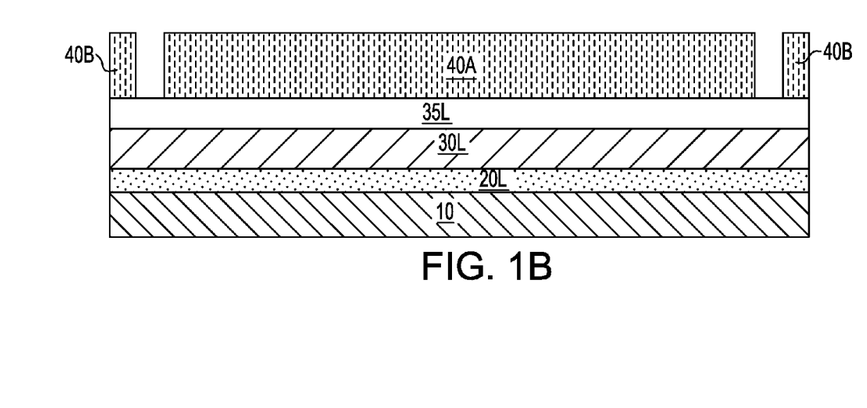
FIG. 1B is a cross-sectional view of the first exemplary semiconductor structure along the vertical plane B-B' of FIG. 1A.

Referring to FIGS. 1A and 1B, a first exemplary semiconductor structure according to an embodiment of the present application includes a stack, from bottom to top, of a substrate 10, a dielectric material layer 20L, an organic planarization layer (OPL) 30L, a hard mask layer 35L and a patterned template layer 40.

The substrate 10 may be any type of material including, but not limited to, a semiconductor substrate, an insulator substrate, a conductor substrate, or a combination thereof. For example, the substrate 10 may be a semiconductor substrate including at least one semiconductor device such as a field effect transistor. The substrate 10 may also include a metal interconnect structure including at least one dielectric material layer and metal lines and/or metal via structures embedded therein.

The dielectric material layer 20L includes a dielectric material such as silicon dioxide, silicon nitride, silicon oxynitride, carbon-doped oxide, organic polymer insulator, or a dielectric metal oxide such as hafnium oxide, aluminum oxide, or a combination thereof. The dielectric material layer 20L can be formed by conventional deposition processes, such as, for example chemical vapor deposition (CVD), plasma-enhanced CVD (PECVD), physical vapor deposition (PVD) or atomic layer deposition (ALD). The thickness of the dielectric material layer 20L can be from 5 nm to 100 nm, although lesser and greater thicknesses can also be employed.

The OPL 30L includes a self-planarizing material. As used herein, a self-planarizing material is a material that flows at standard ambient temperature and pressure (SATP), i.e., 20° C. (293.15 K, 68° F.) and an absolute pressure of 101.325 kPa (14.696 psi, 1 atm), to provide a planar top surface. In one embodiment, the OPL 30L can be an organic material including C, O, and H, and optionally including Si and/or F. The formulation of the OPL 30L can be selected to provide sufficiently low viscosity so that a top surface of the OPL 30L is self-planarizing over underlying topographic features. In one embodiment, the self-planarizing material of the OPL 30L can be an amorphous carbon material. The OPL layer 30L can be formed by spin coating. The thickness of the OPL 30L can be from 10 nm to 300 nm, although lesser and greater thicknesses can also be employed.

The hard mask layer 35L includes a dielectric material such as silicon oxide, silicon nitride, silicon oxynitride, or combinations thereof. The hard mask layer 35L can be formed, for example, by CVD, ALD, or spin-coating. The thickness of the hard mask layer 35L can be from 1 nm to 20 nm, although lesser and greater thicknesses can also be formed. The hard mask layer 35L can be employed to reduce structural or compositional damage to the OPL 30L during removal of polymer blocks at a subsequent processing step.

The patterned template layer 40 is configured to guide the formation of a disconnected serpentine-shaped pattern of a self-assembly material to be subsequently employed. In one embodiment, the patterned template layer 40 includes fin-shaped portions 40A located between a pair of comb-shaped end portions 40B. As used herein, a "fin" refers to a structure having a pair of substantially vertical sidewalls that extend along a lengthwise direction of the structure. A "lengthwise direction" refers to a horizontal direction along which a structure extends the most. In one embodiment, the fin-shaped portions 40A can have rectangular horizontal cross-sectional shapes. The fin-shaped portions 40A can have a width ranging from 10 nm to 500 nm and a lithographic pitch ranging from 90 nm to 500 nm. The lithographic pitch means a pitch that is equal to or greater than a minimum pitch that may be formed by lithographic methods. Each of the comb-shaped end portions 40B includes a main portion extending along a widthwise direction perpendicular to the lengthwise direction and comb lines adjoined to the main portion and extending along the lengthwise direction. Alternating comb lines in each of the comb-shaped end portions 40B are arranged to have a wide pitch (WP) and a narrow pitch (NP). In one embodiment, the WP is about 100 nm, and the NP is about 90 nm. Each fin-shaped portion 40A falls within a space defined by a pair of comb lines having a WP in one end portion 40B and a pair of comb lines having a NP in another end portion 40B.

In one embodiment, the patterned template layer 40 can be formed by depositing a blanket dielectric material layer, applying a photoresist layer (not shown) thereupon, lithographically patterning the photoresist layer, and transferring the pattern of the photoresist layer into the blanket dielectric material layer. In one embodiment, the material of the patterned template layer 40 can be selected such that the material of the patterned template layer 40 has a higher affinity to a second component than to a first component of a self-assembly material to be subsequently employed. For example, the patterned template layer 40 can include hydrogen silsesquioxane (HSQ) or methyl silsesquioxane (MSQ). After forming the patterned template layer 40, the patterned photoresist layer can be removed selective to the patterned template layer 40, for example, by ashing.

Figure 2A:
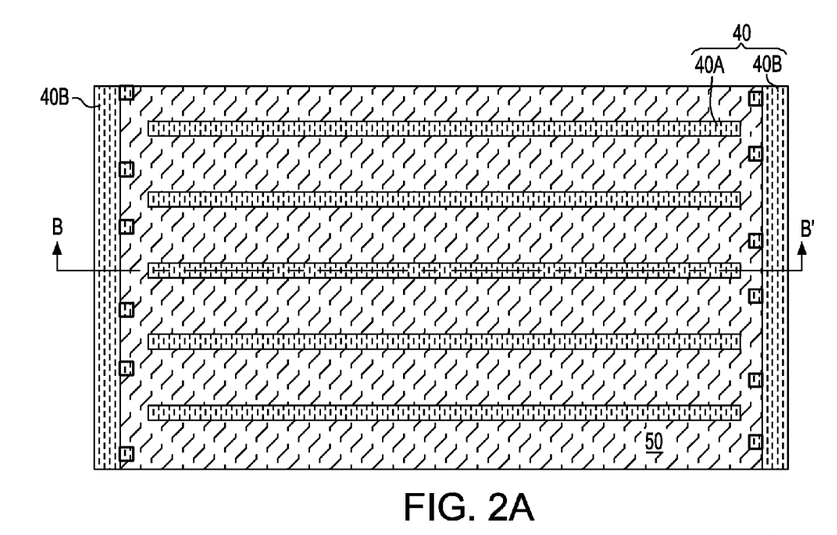
FIG. 2A is a top view of the first exemplary semiconductor structure after applying a self-assembly material into a contiguous trench defined by the patterned template layer to form a self-assembly material layer.
Figure 2B:
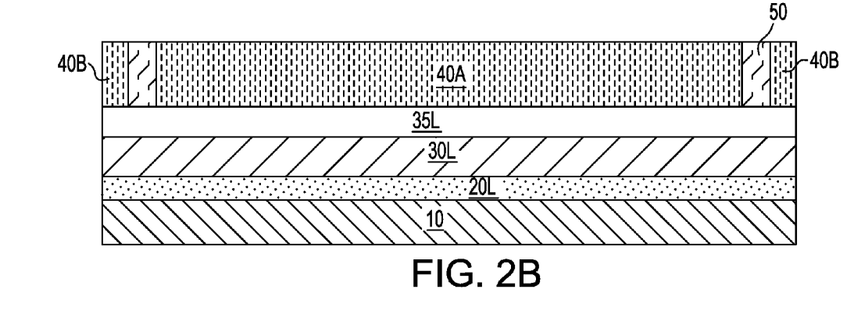
FIG. 2B is a cross-sectional view of the first exemplary semiconductor structure along the vertical plane B-B' of FIG. 2A.

Referring to FIGS. 2A and 2B, a self-assembly material is applied into a contiguous trench defined by the patterned template layer 40 to form a self-assembly material layer 50. The self-assembly material may be applied, for example, by spin coating. In one embodiment of the present application, the self-assembly material layer 50 has a thickness equal to a height of the patterned template layer 40.

The self-assembly material may be any material capable of forming a self-assembled periodic pattern. In one embodiment, the self-assembly material is a block copolymer. The block copolymer includes two or more immiscible polymeric block components and under suitable conditions, the two or more immiscible polymeric block components separate into two or more different phases on a nanometer scale and thereby form ordered nanometer-scale patterns. Suitable block copolymers include, but are not limited to, polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA). In one embodiment, the self-assembly material layer 50 includes a PS-b-PMMA diblock copolymer.

Figure 3A:
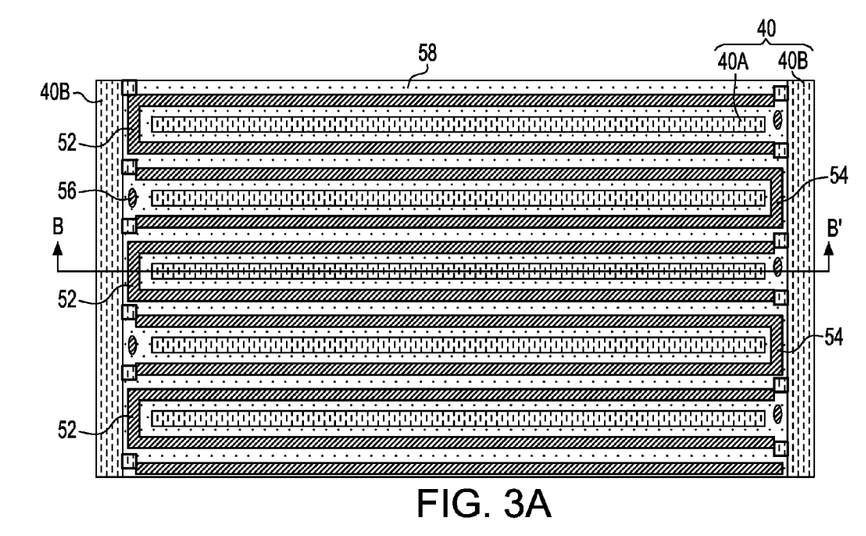
FIG. 3A is a top view of the first exemplary semiconductor structure after phase separation of the self-assembly material to form a self-assembly nanostructure including a plurality of first U-shaped lines, a plurality of second U-shaped lines and a plurality of dots in a matrix.
Figure 3B:
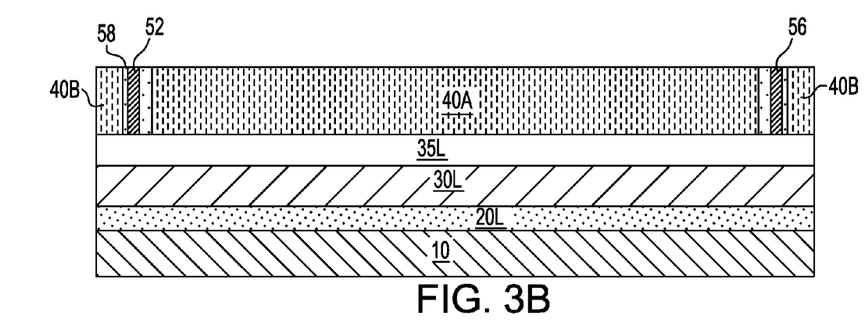
FIG. 3B is a cross-sectional view of the first exemplary semiconductor structure along the vertical plane B-B' of FIG. 3A.

Referring to FIGS. 3A and 3B, a self-assembly nanostructure including, in top view, a plurality of first U-shaped lines 52, a plurality of second U-shaped lines 54 and a plurality of dots 56 distributed in a matrix 58 is formed. The U-shaped lines 52, 54 and the dots 56 contain a first component of the self-assembly material, while the matrix 58 contains a second component of the self-assembly material that has a higher affinity to the patterned template layer 40. In one embodiment and when the self-assembly material layer 50 is composed of a PMMA-b-PS block copolymer and the patterned template layer 40 is composed of HSQ, the U-shaped lines 52, 54 and the dots 56 are composed of the PMMA block, while the matrix 58 is composed of the PS block. In one embodiment, the self-assembly nanostructure 52, 54, 56, 58 can be formed by annealing the self-assembly material layer 50 at an elevated temperature. The anneal that induces microphase separation of the immiscible components of the self-assembly material may be performed, for example, at a temperature from 100° C. to 300° C. The domain size of the self-assembly nanostructure (52, 54, 56, 58) so formed is typically in the range of 5 to 35 nm, which is a sub-lithographic dimension, i.e., a dimension that is less than the minimum pitch of a pattern that can be formed by lithographic methods.

Each of the first U-shaped lines 52 includes straight portions extending in the lengthwise direction and a bent portion connecting the straight portions and located adjacent to one comb-shaped end portion 40B of the patterned template layer 40. Each of the second U-shaped lines 54 includes straight portions extends in the lengthwise direction and a bent portion connecting the straight portions and located adjacent to another comb-shaped end portion 40B of the patterned template layer 40. The first U-shaped lines 52 are separated from one another by one of the second U-shaped lines 54. The dots 56 are located at open ends of the first U-shaped lines 52 and the second U-shaped lines 54. The spacing between the straight portions of each of the first U-shaped liners 52 and the second U-shaped liners 54 is determined by the width of the fin-shaped portions 40A and the domain size of the portions of the matrix 58 adjoined to the fin-shaped portions 40A and can range from 20 nm to 570 nm.

Figure 4A:
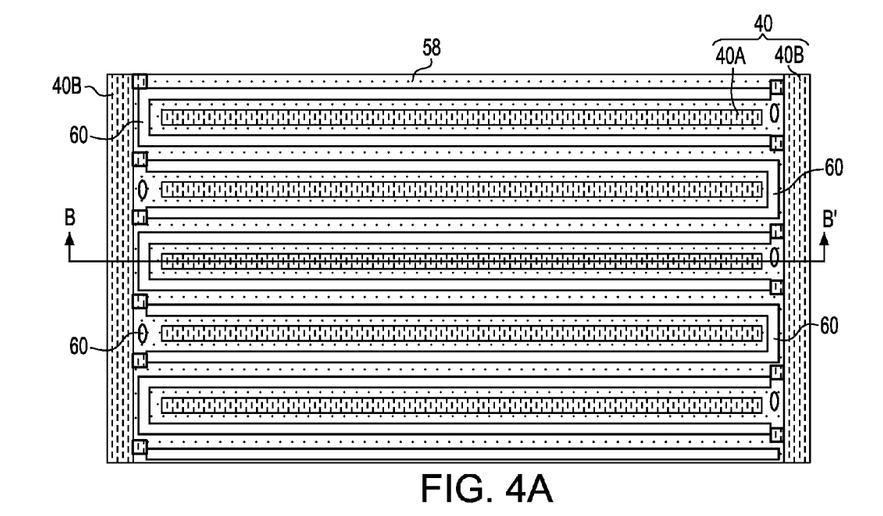
FIG. 4A is a top view of the first exemplary semiconductor structure after removing the plurality of first U-shaped lines, the plurality of second U-shaped lines and the plurality of dots to form a first pattern of openings in the matrix.
Figure 4B:
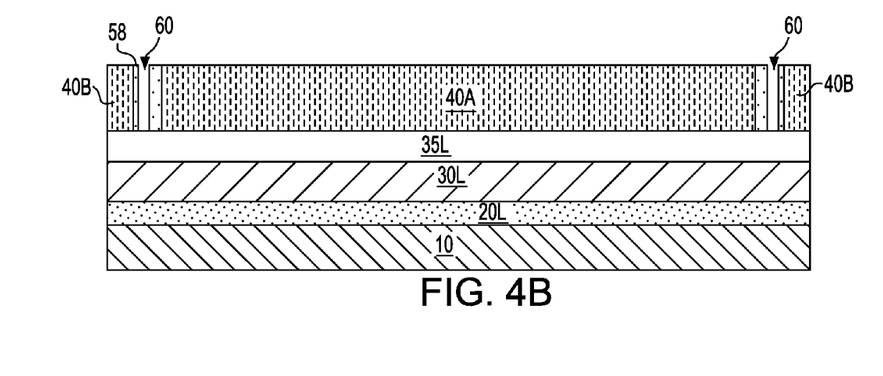
FIG. 4B is a vertical cross-sectional view of the first exemplary patterned structure along the vertical plane B-B' of FIG. 4A.

Referring to FIGS. 4A and 4B, a first pattern of openings 60 is formed after removing the U-shaped lines 52, 54 and the dots 56 selective to the matrix 58, the hard mask layer 35L, and the patterned template layer 40. The U-shaped lines 52, 54 and the dots 56 may be removed by an anisotropic etch which can be a dry etch or a chemical wet etch. The first pattern of openings 60 exposes portions of the top surface of the hard mask layer 35L.

Figures 5A, 5B:
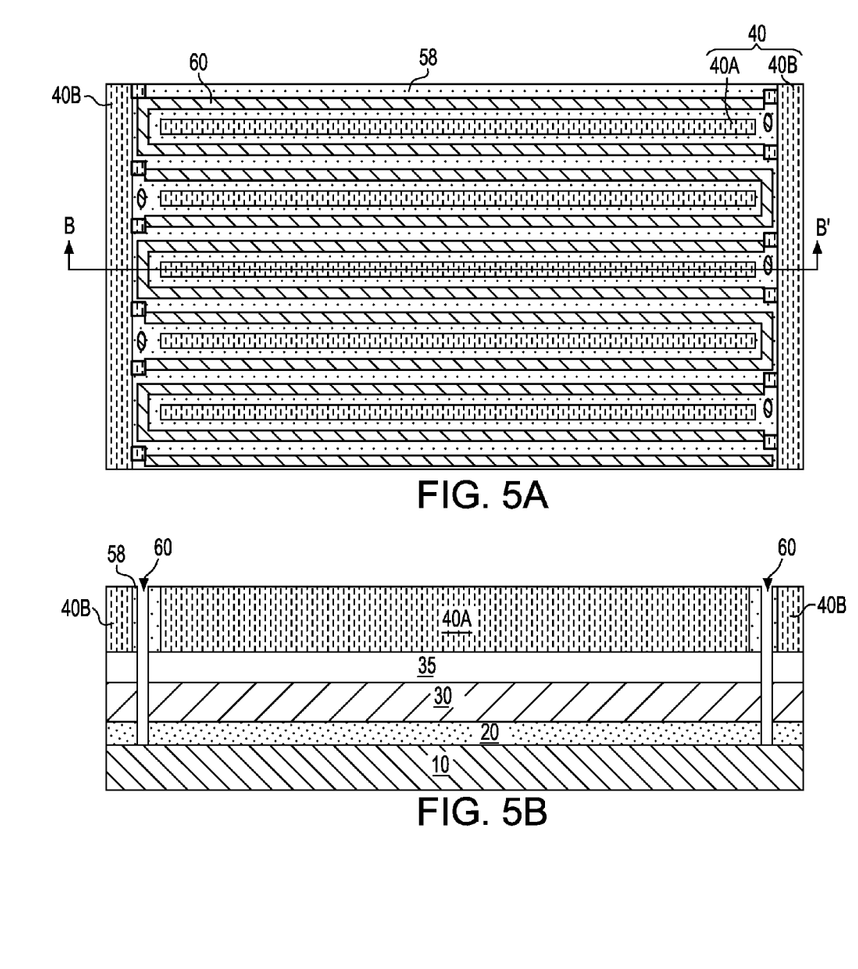
FIG. 5A is a top view of the first exemplary semiconductor structure after transferring the first pattern of openings into the hard mask layer, the OPL and the dielectric material layer.
FIG. 5B is a cross-sectional view of the first exemplary semiconductor structure along the vertical plane B-B' of FIG. 5A.

Referring to FIGS. 5A and 5B, the first pattern of openings 60 is transferred into the hard mask layer 35L, the OPL 30L and the dielectric material layer 20L by an anisotropic etch that employs the matrix 58 and the patterned template layer 40 as an etch mask. The chemistry of the anisotropic etch can be selected so that the materials of the hard mask layer 35L, the OPL 30L and the dielectric material layer 20L are etched, while the materials of the matrix 58 and the patterned template layer 40 are not significantly etched. The physically exposed portions of the hard mask layer 35L and the underlying OPL 30L and dielectric material layer 20L are etched through until the top surface of the substrate 10 is physically exposed. In some embodiments of the present application, some of the matrix 58 may be consumed during the anisotropic etch (not shown). Further, some of the patterned template layer 40 may be consumed during the anisotropic etch (not shown). The remaining hard mask layer 35L constitutes a patterned hard mask layer 35. The remaining OPL 30L constitutes a patterned OPL 30. The remaining dielectric material layer 20L constitutes a patterned dielectric material layer 20.

Figure 6A:
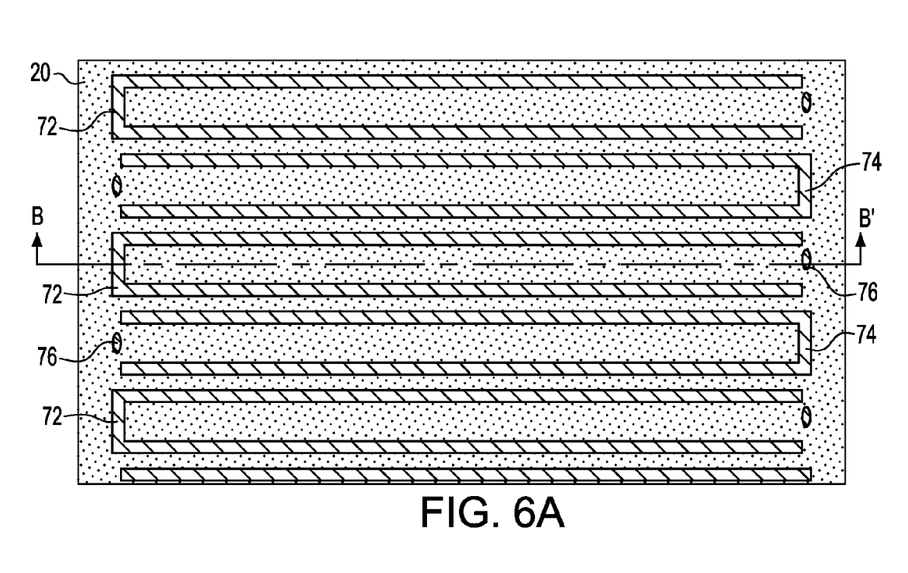
FIG. 6A is a top view of the first exemplary semiconductor structure after removing the patterned template layer, the remaining hard mask layer and the remaining OPL to form a plurality of first U-shaped trenches, a plurality of second U-shaped trenches and a plurality of dot-shaped trenches in the dielectric material layer.
Figure 6B:
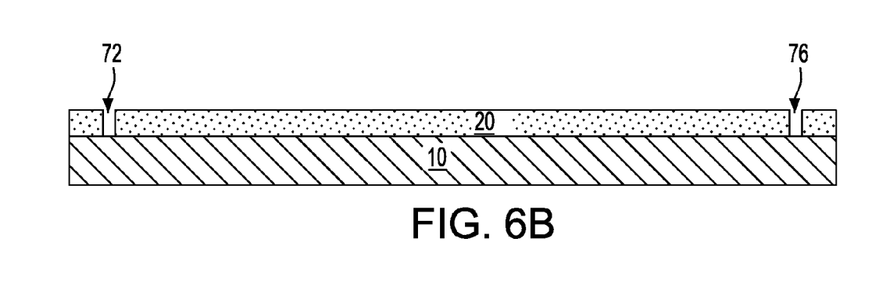
FIG. 6B is a cross-sectional view of the first exemplary semiconductor structure along the vertical plane B-B' of FIG. 6A.

Referring to FIGS. 6A and 6B, after the first pattern of openings 60 is transferred into the dielectric material layer 20L, any remaining portions of the patterned template layer 40 and the matrix 50B, the patterned hard mask layer 35 and the patterned OPL 30 are removed selective to materials of the patterned dielectric material layer 20 and the substrate 10. In one embodiment, the removal of the remaining portions of the patterned template layer 40 and the matrix 58, the patterned hard mask layer 35 and the pattern OPL 30 can be performed by a wet etch. A plurality of trenches is thus formed within the patterned dielectric material layer 20. The trenches include, in top view, first U-shaped line trenches 72 having bent portions located at one end of the substrate 10, second U-shaped line trenches 74 having bent portions located at another end of the substrate 10, and dot-shaped trenches 76 located at the open ends of the U-shaped line trenches 72, 74. The first U-shaped line trenches 72 are separated from one another by one of the second U-shaped line trenches 74.

Figure 7A:
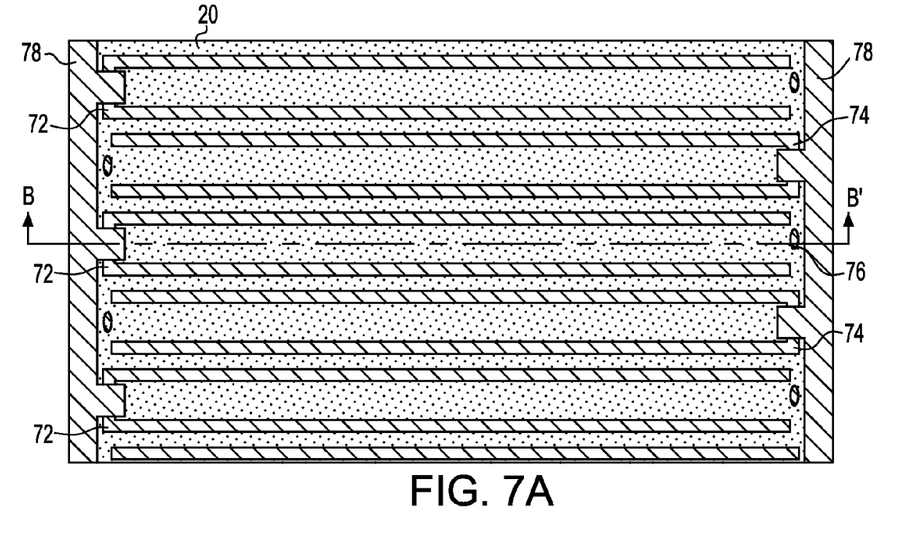
FIG. 7A is a top view of the first exemplary semiconductor structure after forming a pair of comb-shaped contact trenches intersecting bent portions of the plurality of first U-shaped trenches and the plurality of second U-shaped trenches within the dielectric material layer.
Figure 7B:
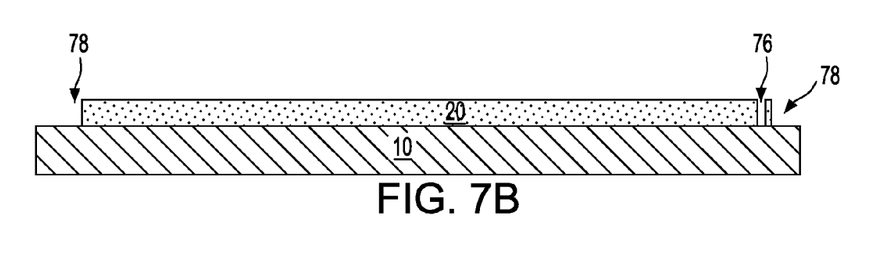
FIG. 7B is a cross-sectional view of the first exemplary semiconductor structure along the vertical plane B-B' of FIG. 7A.

Referring to FIGS. 7A and 7B, a pair of contact trenches 78 is formed within the patterned dielectric material layer 20 on opposite ends of the substrate 10. In one embodiment and as shown in FIG. 7A, each contact trenches 78 has, in top view, a comb-shaped structure comprising a main portion extending along the widthwise direction and a plurality of parallel protruding portion extending along the lengthwise direction and intersecting bent portions of U-shaped line trenches 72, 74. The contact trenches 78 may be formed by lithography and etching processes. For example, a photoresist layer (not shown) may be applied and lithographically patterned to form openings therein. The pattern of the openings in the photoresist layer is transferred into the patterned dielectric material layer 20 to form the contact trenches 78.

Figure 8A:
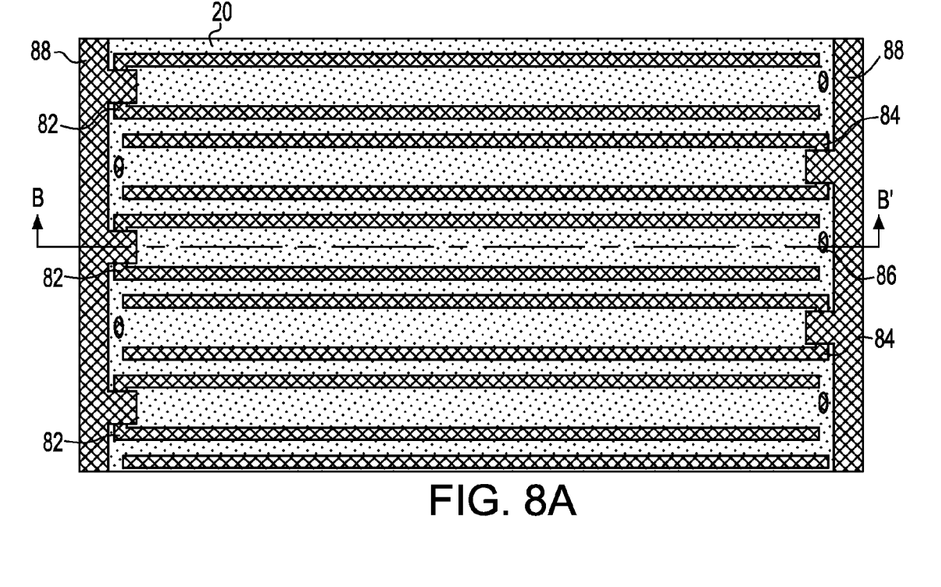
FIG. 8A is a top view of the first exemplary semiconductor structure after forming a plurality of first electrode, a plurality of second electrode, a plurality of conductive dots and a pair of contact pads embedded in the dielectric material layer.
Figure 8B:
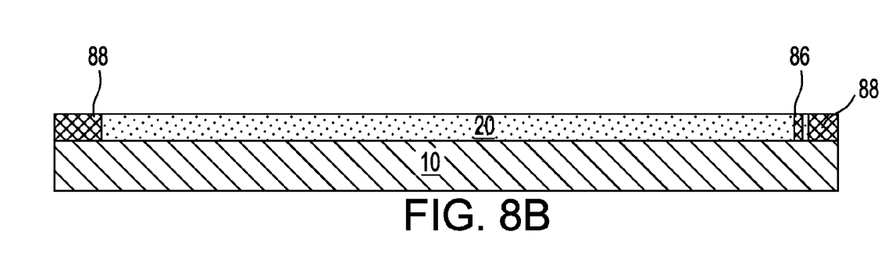
FIG. 8B is a cross-sectional view of the first exemplary semiconductor structure along the vertical plane B-B' of FIG. 8A.

Referring to FIGS. 8A and 8B, a conductive material is deposited within U-shaped line trenches 72, 74, the dot-shaped trenches 76 and the contact trenches 78. The conductive material includes a metal such as, example, tungsten, aluminum, copper or their alloys. The excess conductive material is removed by planarization from above the top surface of the patterned dielectric material layer 20. The remaining portions of the conductive material within the first U-shaped line trenches 74 constitute a plurality of first U-shaped electrodes 82, the remaining portions of the conductive material within the second U-shaped line trenches 74 constitute a plurality of second U-shaped electrodes 84, the remaining portions of the conductive material within the dot-shaped trenches 76 constitutes a plurality of conductive dots 86 and the remaining portions of the conductive material within the contact trenches 78 constitute contact pads 88. Adjacent straight portions of the neighboring first U-shaped electrode 82 and second U-shaped electrode 84 constitute an electrode pair. The pitch of the electrode pairs is determined by the domain size of the self-assembly nanostructure (52, 54, 56, 58), thus is a sub-lithographic pitch, i.e., a pitch that is less than a minimum pitch that may be formed by lithographic methods. For example, the pitch of the electrode pairs can be from 10 nm to 70 nm. Each of the contact pads 88 overlaps and contacts the bent portion of a corresponding one of the first U-shaped electrodes 82 and the second U-shaped electrodes 84, thus forming interconnects for the electrode pairs.

Figure 9A:
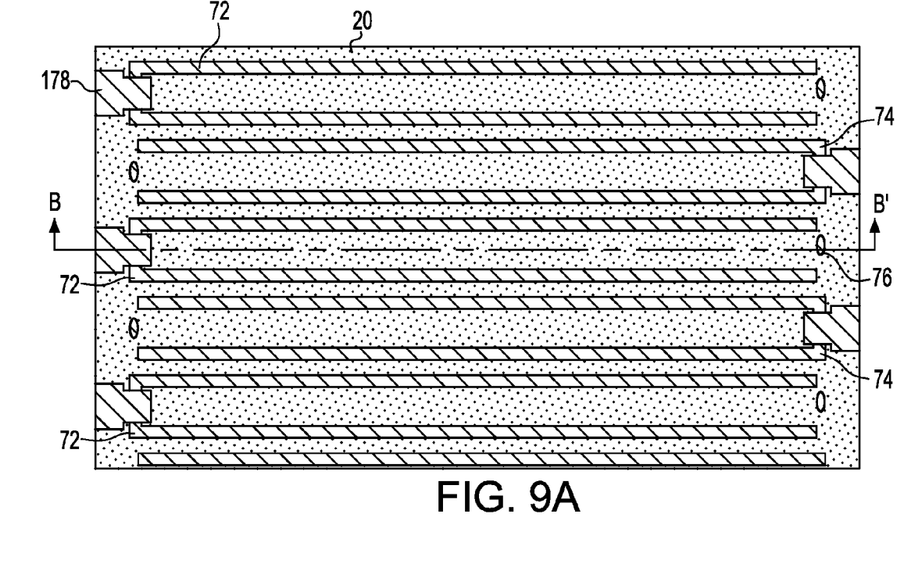
FIG. 9A is a top view of a second exemplary semiconductor structure after forming a plurality of contact trenches intersecting bent portions of the plurality of first U-shaped trenches and the plurality of second U-shaped trenches within the dielectric material layer according to an embodiment of the present disclosure.
Figure 9B:
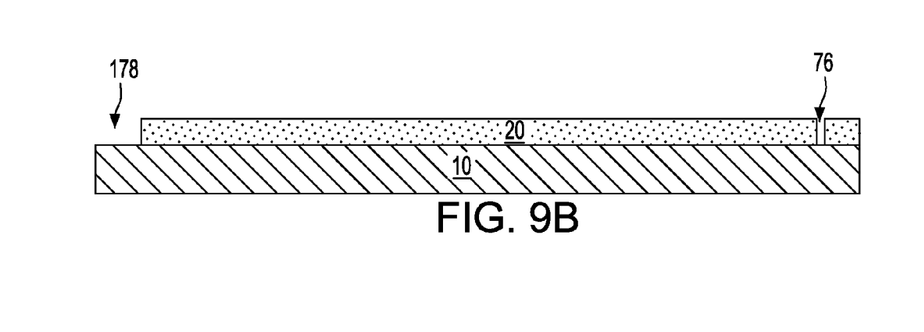
FIG. 9B is a cross-sectional view of the second exemplary semiconductor structure along the vertical plane B-B' of FIG. 9A.

Referring to FIGS. 9A and 9B, a second exemplary semiconductor structure can be derived from the first exemplary semiconductor structure of FIGS. 6A and 6B by forming a plurality of contact trenches 178 within the dielectric material layer 20. Each of the contract trenches 178 overlaps the bent portion of one of U-shaped line trenches 72, 74. The contact trenches 178 can be formed by the lithographic and etching processes of FIGS. 7A and 7B.

Figure 10A:
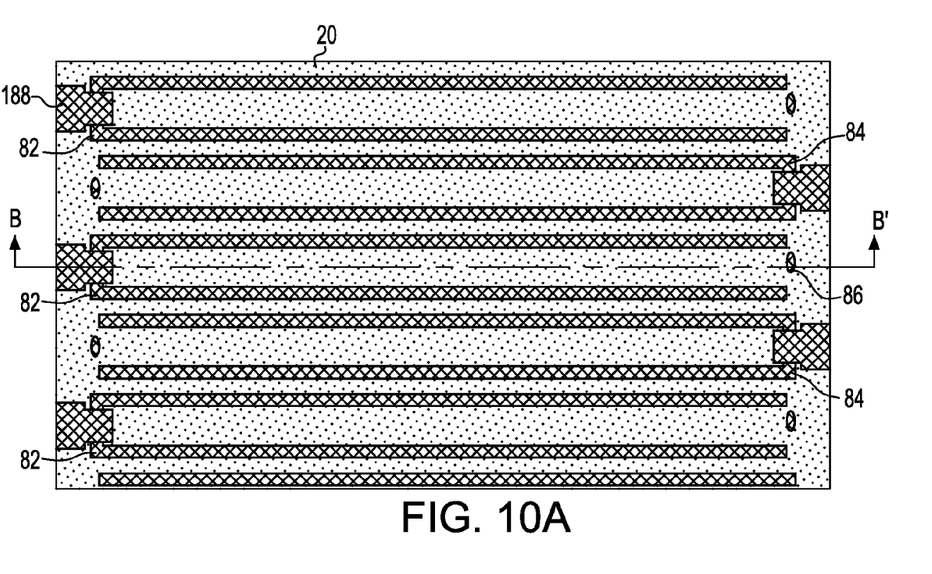
FIG. 10A is a top-down view of the second exemplary semiconductor structure after forming a plurality of first electrode, a plurality of second electrode, a plurality of conductive dots and a plurality of contact pads embedded in the dielectric material layer.
Figure 10B:
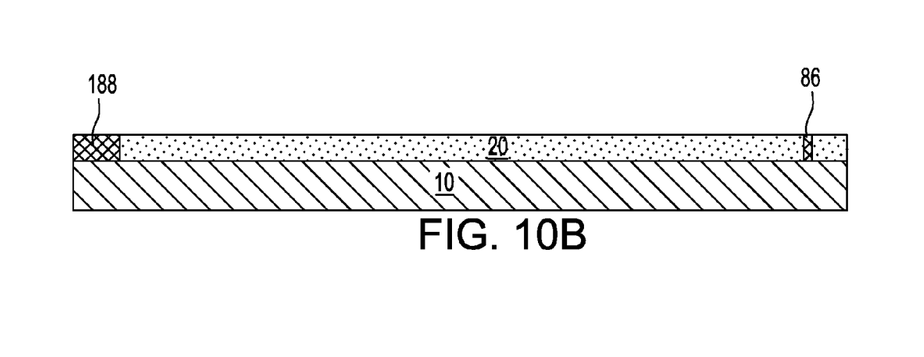
FIG. 10B is a cross-sectional view of the second exemplary patterned structure along the vertical plane B-B' of FIG. 10A.

Referring to FIGS. 10A and 10B, the processing steps of FIGS. 8A and 8B can be performed. The first and the second U-shaped line trenches 72, 74, the dot-shaped trenches 76 and the contact trenches 178 can be filled with a conductive material to form a plurality of first U-shaped electrodes 82 within the first U-shaped line trenches 72, a plurality of second U-shaped electrodes 84 within the second U-shaped line trenches 74, a plurality of conductive dots 86 within the dot-shaped trenches 76, and a plurality of contact pads 188 within the contact trenches 178. Each of the contact pads 188 overlaps and contacts the bent portion of a corresponding first electrode 182 or second electrode 184.

In the present application, the contact pads (88, 188) are in contact with bent portions of the U-shaped electrode 82, 84 to interconnect the electrode pairs. Because bent portions have a greater dimension than that of the straight portions of the U-shaped electrode 82, 84, the placement tolerance of the contact pads (88, 88) are thus enhanced.

While the present disclosure has been described in terms of specific embodiments, it is evident in view of the foregoing description that numerous alternatives, modifications and variations will be apparent to those skilled in the art. Each of the various embodiments of the present disclosure can be implemented alone, or in combination with any other embodiments of the present disclosure unless expressly disclosed otherwise or otherwise impossible as would be known to one of ordinary skill in the art. Accordingly, the present disclosure is intended to encompass all such alternatives, modifications and variations which fall within the scope and spirit of the present disclosure and the following claims.

What is claimed is:

1. A method of forming a semiconductor structure comprising:

forming a patterned template layer over a dielectric material layer disposed on a substrate, wherein the patterned template layer comprises a contiguous trench configured to guide self-assembly of a self-assembly material;

depositing a self-assembly material onto the dielectric material layer, the self-assembly material filling the contiguous trench;

annealing the self-assembly material to cause self-assembly of the self-assembly material such that a self-assembly nanostructure comprising a plurality of first U-shaped lines and a plurality of second U-shaped lines distributed in a matrix is formed, wherein each of the plurality of first U-shaped lines includes straight portions extending substantially in parallel and a bent portion connecting the straight portions and located on one end of the dielectric material layer, each of the plurality of second U-shaped lines includes straight portions extending substantially in parallel and a bent portion connecting the straight portions and located on an opposite end of the dielectric material layer, and the plurality of first U-shaped lines are separated from one another by one of the plurality of second U-shaped lines;

forming a plurality of first U-shaped trenches by transferring a pattern of the plurality of first U-shaped lines into the dielectric material layer and a plurality of second U-shaped trenches by transferring a pattern of the plurality of second U-shaped lines into the dielectric material layer;

forming a plurality of contact trenches in the dielectric material layer, the plurality of contact trenches intersecting the bent portions of the plurality of first U-shaped trenches and the plurality of second U-shaped trenches; and filling the plurality of first U-shaped trenches, the plurality of second U-shaped trenches and the plurality of contract trenches by a conductive material.

2. The method of claim 1, wherein the plurality of first U-shaped lines and the plurality of second U-shaped lines comprises a first component of the self-assembly material, the matrix comprises a second component of the self-assembly material that has a higher affinity to the patterned template layer.

3. The method of claim 2, wherein the self-assembly material comprises a block copolymer.

4. The method of claim 1, further comprising forming an organic planarization layer (OPL) over the dielectric material layer and a hard mask layer over the OPL, wherein the patterned template layer is formed on the hard mask layer.

5. The method of claim 4, wherein the patterned template layer is formed by:
   forming a blank template layer over the hard mask layer;
   forming a photoresist layer over the blank template layer;
   lithographically exposing and etching the photoresist layer; and
   transfer a pattern in the photoresist layer into the blanket template layer to form the patterned template layer.

6. The method of claim 5, wherein the patterned template layer comprises parallel fin-shaped portions extending along a lengthwise direction and located between a pair of comb-shaped end portions, wherein each of the comb-shaped end portions comprises a main portion extending along a widthwise direction perpendicular to the lengthwise direction and a plurality of comb lines adjoined to the main portion and extending along the lengthwise direction, wherein alternate comb lines in each of the comb-like end portions are arranged to have a wide pitch and a narrow pitch, and each of the fin-shaped portion falls within a space defined by a pair of comb lines having a wide pitch in one comb-shaped end portion and a pair of comb lines having a narrow pitch in another comb-shaped end portion.

7. The method of claim 6, wherein the bent portions of the plurality of first U-shaped lines and the plurality of second U-shaped lines are parallel to the main portion of each of the comb-shaped end portions, and the straight portions of the plurality of the plurality of first U-shaped lines and the plurality of second U-shaped lines are parallel to the fin-shaped portions.

8. The method of claim 7, further comprising removing the plurality of first U-shaped lines and the plurality of second U-shaped lines to form a first pattern of openings in the matrix.

9. The method of claim 8, wherein each of the straight portions in the plurality of first U-shaped lines is separated from an adjacent straight portion of the plurality of second U-shaped lines by a sub-lithographic spacing.

10. The method of claim 9, further comprising removing the patterned template layer, a patterned hard mask layer and a patterned OPL from a patterned dielectric material layer after the forming the plurality of first U-shaped trenches and the plurality of second U-shaped trenches.

11. The method of claim 1, wherein each of the plurality of contact trenches intersecting the bend portion of one of the plurality of first U-shaped trench and the plurality of second U-shaped trenches.

12. The method of claim 1, wherein the plurality of contact trenches comprises a pair of comb-shaped contact trenches, wherein each of the comb-shaped contact trenches comprises a main portion extending along a direction parallel to the bent portions of the plurality of the first U-shaped trenches and the plurality of second U-shaped trenches and a plurality of protruding portions extending along a direction parallel to the straight portions of the plurality of the first U-shaped trenches and the plurality of second U-shaped trenches, each of said plurality of protruding portions in one comb-shaped contact trenches intersecting one bent portion of the plurality of first U-shaped trenches, and each of said plurality of protruding portions in another comb-shaped contact trenches intersecting one bent portion of the plurality of second U-shaped trenches.

* * * * *